(12) United States Patent
Kang et al.

(10) Patent No.: US 8,018,267 B2
(45) Date of Patent: Sep. 13, 2011

(54) FREQUENCY CONVERSION MIXER

(75) Inventors: Yun-mo Kang, Seoul (KR); Tae-yeoul Yun, Seoul (KR); Hee-woo An, Seoul (KR); Chang Sun Kim, Seoul (KR); Yea Chul Roh, Seongnam (KR); Seong Hoon Choi, Seoul (KR)

(73) Assignees: Electronics and Telecommunications Research Institute, Daejeon (KR); Industry-University Cooperation Foundation Hanyang Univ., Seoul (KR)

( * ) Notice: Subject to any disclaimer, the term of this patent is extended or adjusted under 35 U.S.C. 154(b) by 0 days.

(21) Appl. No.: 12/819,144

(22) Filed: Jun. 18, 2010

(65) Prior Publication Data

US 2011/0148478 A1    Jun. 23, 2011

(30) Foreign Application Priority Data

Dec. 18, 2009   (KR) .................. 10-2009-0127219

(51) Int. Cl.
G06G 7/12 (2006.01)
(52) U.S. Cl. .................. 327/359; 327/355; 455/326
(58) Field of Classification Search .......... 327/355–361; 455/323, 326
See application file for complete search history.

(56) References Cited

U.S. PATENT DOCUMENTS

| | | | | |
|---|---|---|---|---|
| 6,892,062 B2 * | 5/2005 | Lee et al. | ...................... | 455/326 |
| 7,446,590 B2 * | 11/2008 | Chung | ........................... | 327/355 |
| 7,514,981 B2 | 4/2009 | Yang et al. | | |
| 2008/0132194 A1 | 6/2008 | Ji et al. | | |

FOREIGN PATENT DOCUMENTS

KR           100814322 B1      11/2008

OTHER PUBLICATIONS

Dukju Ahn et al., "A K-Band High-Gain Down-Conversion Mixer in 0.18 μm CMOS Technology", IEEE Microwave and Wireless Components Letters, 2000, pp. 1-3, vol. 36, No. 8, IEEE.

* cited by examiner

*Primary Examiner* — Dinh T. Le

(57) ABSTRACT

Provided is a frequency conversion mixer. The frequency conversion mixer includes a transconductance stage, a switching stage, a load stage, a current bleeding circuit, and a bias stage. The transconductance stage receives an RF signal, and outputs a current corresponding to a voltage of the RF signal. The switching stage switches the current which is outputted from the transconductance stage in response to a local oscillation signal, for frequency conversion the RF signal into an intermediate frequency (IF) signal. The load stage is connected between the switching stage and a supply voltage terminal. The current bleeding circuit is connected parallel with the switching stage, especially, embodying inverter structure with transconductance stage to get not only current bleeding effect but also current reuse effect, and one resonant inductor for reducing noise which is generated in parasitic capacitance at node between transconductance stage and switching stage. The bias stage is connected between the transconductance stage and a ground terminal, and has the switched biasing technique for allowing not only the stable bias current but also lowering the flicker noise.

6 Claims, 4 Drawing Sheets

US 8,018,267 B2

FREQUENCY CONVERSION MIXER

CROSS-REFERENCE TO RELATED APPLICATIONS

This U.S. non-provisional patent application claims priority under 35 U.S.C. §119 of Korean Patent Application No. 10-2009-0127219, filed on Dec. 18, 2009, the entire contents of which are hereby incorporated by reference.

BACKGROUND OF THE INVENTION

The present invention disclosed herein relates to a frequency conversion mixer.

A millimeter wave denotes an electromagnetic wave having the wavelength of a millimeter unit. This corresponds to a frequency of 30 to 300 GHz in terms of a frequency band. To provide a description on the trend of a millimeter-wave frequency band to date, a frequency band of 20 to 40 GHz is currently being extended for fixed and mobile on the basis of advanced technologies in satellite communication and military communication.

Generally, the size of a component becomes smaller when implementing a system because a millimeter wave has a very short wavelength, and thus a millimeter wave cannot be used for the implementing of a lumped element. To date, most circuits are implemented with integrated circuits such as GaAs or InP-based MMIC in which a parasitic effect is small. On the other hand, it is difficult to commercialize and popularize a product because of the relatively high cost of production.

As process technologies recently advance, research and development are being made on circuits such as LNA, mixers and synthesizers that may operate in a millimeter wave, based on Complementary Metal-Oxide Semiconductor (CMOS).

SUMMARY OF THE INVENTION

The present invention provides a frequency conversion mixer, which increases a conversion gain and improves noise characteristic. To improve a conversion gain and noise characteristic, the inverter structure and the switched biasing technique are used, respectively.

The present invention also provides a frequency conversion mixer, which can decrease an occupied area even while improving conversion gain and noise characteristic. Generally, a frequency conversion mixer operating on millimeter wave needs many inductors to improve high frequency characteristics such as a high gain, a wideband gain, and a low noise figure. The present invention provides a frequency conversion mixer, which uses only one inductor. Therefore, an occupied area is decreased rather than previous works.

Embodiments of the present invention provide a frequency conversion mixer including: a transconductance stage receiving a Radio Frequency (RF) signal, and providing a current corresponding to a voltage of the RF signal; a switching stage switching the current which comes out from the transconductance stage in response to a local oscillation signal, for down converting the RF signal into an intermediate frequency (IF) signal; a load stage connected between the switching stage and a supply voltage terminal; a current bleeding circuit connected parallel with the switching stage, especially, embodying an inverter structure with transconductance stage to obtain not only a current bleeding effect but also a current reuse effect; one resonant inductor between differential outputs of the transconductance stages, reducing noise which is generated in parasitic capacitance at node between the transconductance stage and the switching stage and also improving the gain response; and a bias stage connected between the transconductance stage and a ground terminal, having at least one current source for allowing a stable bias current.

In some embodiments, the RF signal may be included in a K band (about 18 to 26 GHz) close to a millimeter wave.

In other embodiments, the current bleeding stage may increase a conversion gain of the frequency conversion mixer.

In still other embodiments, the bias stage may, be activated for a switched biasing in response to the intermediate frequency (IF) signal.

In other embodiments of the present invention, a frequency conversion mixer includes: a first transistor having a gate receiving a positive Radio Frequency (RF) signal, and a drain connected to a first node; a second transistor having a gate receiving a negative RF signal, a drain connected to a second node, and a source connected to a source of the first transistor; a resonant inductor connected between the first node and the second node; a third transistor having a gate receiving the positive RF signal, a source connected to a supply voltage terminal, and a drain connected to the first node; a fourth transistor having a gate receiving the negative RF signal, a source connected to the supply voltage terminal, and a drain connected to the second node; a fifth transistor having a gate receiving a positive oscillation signal, a drain connected to a positive output node, and a source connected to the first node; a sixth transistor having a gate receiving a negative oscillation signal, a drain connected to a negative output node, and a source connected to the first node; a seventh transistor having a gate receiving the positive oscillation signal, a drain connected to the positive output node, and a source connected to the second node; an eighth transistor having a gate receiving the negative oscillation signal, a drain connected to the negative output node, and a source connected to the second node; a first resistor connected between the positive output node and the supply voltage terminal; a second resistor connected between the negative output node and the supply voltage terminal; and a bias stage connected between the source of the first transistor and the ground terminal.

In some embodiments, the bias stage may include: a ninth transistor having a gate connected to the positive output node, a drain connected to the source of the first transistor, and a source connected to the ground terminal; and a tenth transistor having a gate connected to the negative output node, a drain connected to the source of the first transistor, and a source connected to the ground terminal.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
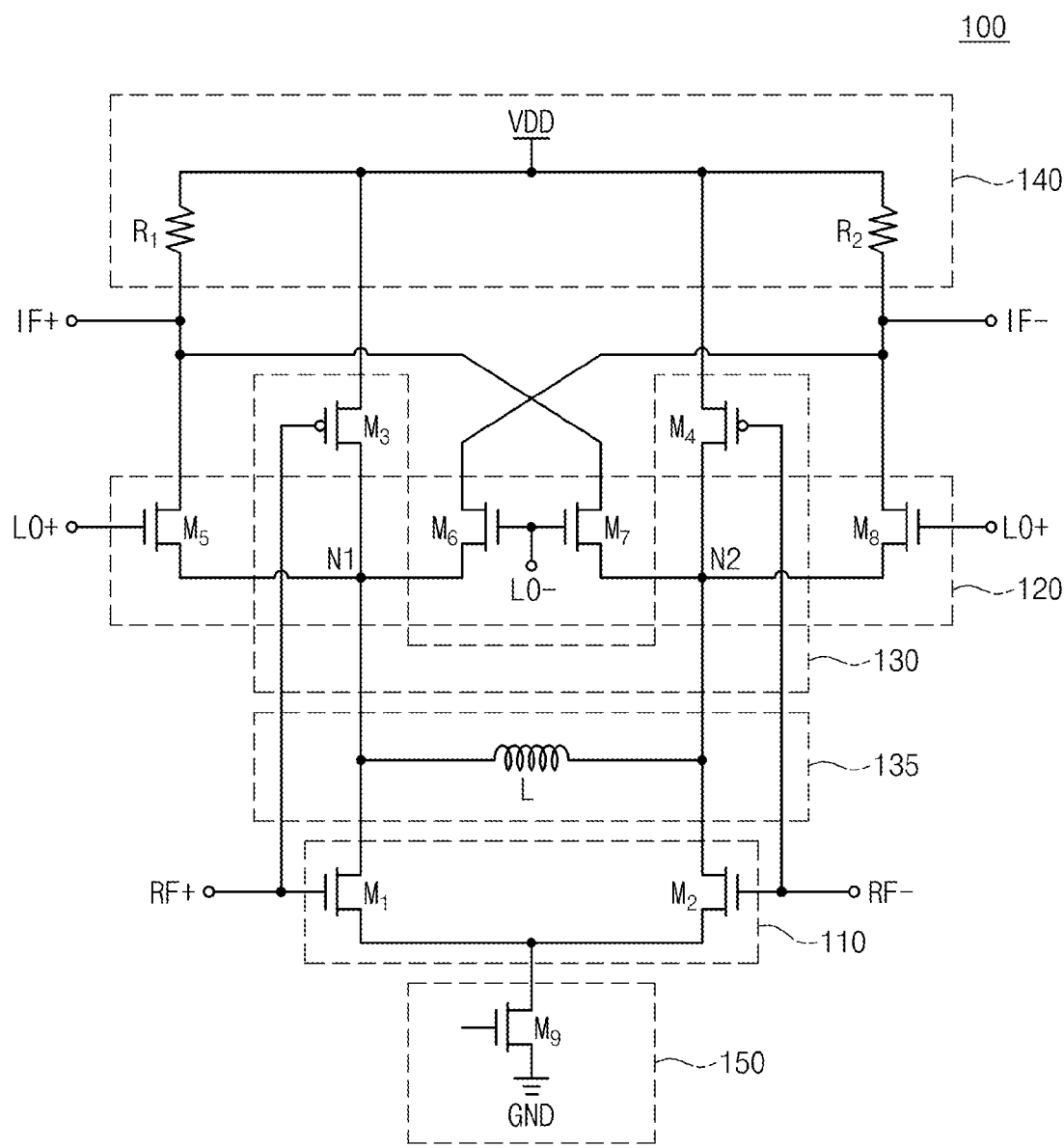
FIG. 1 is a diagram illustrating a frequency conversion mixer according to an embodiment of the present invention.

FIG. 1 is a diagram illustrating a frequency conversion mixer according to an embodiment of the present invention.

Referring to FIG. 1, a frequency conversion mixer 100 according to an embodiment of the present invention includes a transconductance stage 110 which receives a Radio Frequency (RF) signal, a switching stage 120 which mixes the received RF signal with a local oscillation signal to generate an Intermediate Frequency (IF) signal, a current bleeding circuit 130 which increases the conversion gain ($A_v$) of the frequency conversion mixer 100, a resonant inductor L 135 which resonates the parasitic capacitors in the node N1 and N2 to improve the noise characteristic, the conversion gain and the frequency band, a load stage 140, and a bias stage 150 which provides a stable current to the transconductance stage 110.

The frequency conversion mixer 100 mixes RF signals RF+ and RF−, which can be received through an antenna in a reception part, with oscillation signals LO+ and LO− that are generated in a local oscillator (not shown) to convert the RF signals into IF signals IF+ and IF− that corresponds to frequency difference between the RF signals RF+ and RF− and the oscillation signals LO+ and LO− while maintaining the information of the RF signals RF+ and RF−.

The transconductance stage 110 receives and amplifies the RF signals RF+ and RF−. The transconductance stage 110 includes transistors M1 and M2. The RF signals RF+ and RF− are inputted to the gates of the transistors M1 and M2, respectively. Herein, the respective transistors M1 and M2 provide currents, corresponding to the voltages of the RF signals RF+ and RF− which are applied to the gates, to the switching stage 120. The phase of the RF signal RF+ is opposite to that of the RF signal RF−.

The switching stage 120 switches the received RF signals RF+ and RF− and the oscillation signals LO+ and LO− together to mix the frequencies. That is, the switching stage 120 switches a current, which is generated by the transconductance stage 110, to shift the frequencies of the RF signals RF+ and RF−. The switching stage 120 includes transistors M5 to M8.

The respective oscillation signals LO+ and LO− that are inputted from the local oscillator are inputted to the gates of the transistors M5 and M8 and the gates of the transistors M6 and M7. Herein, the phase of the oscillation signal LO+ is opposite to that of the oscillation signal LO−. The RF signals RF+ and RF− are modulated through the switching operation of the switching stage 120 based on the oscillation signals LO+ and LO−.

The down converted IF signals IF+ and IF− have a new frequency. For example, an IF frequency (FIF) is a value of an oscillation frequency (FLO) subtracted from an RF frequency (FRF).

The current bleeding circuit 130 provides a bleeding current to first and second nodes N1 and N2. Herein, the current bleeding technique is one that allows a certain amount of current among a current, which flows in the transistors M5 to M8 of the switching stage 120, to flow in the current bleeding circuit 130, and thus allows a small amount of current to flow in the load stage 140 while maintaining the transconductance $g_m$ of the transconductance stage 110 as-is. Herein, a small amount of current flowing in the load stage 140 denotes that the voltage drop of the load stage 140 is small. That is, this denotes becoming more independent from the voltage headroom. As the amount of a current flowing in the load stage 140 decreases, the load resistance value $R_D$ may largely be set. As expressed in Equation (1), the conversion gain $A_v$ of the frequency conversion mixer 100 may increase.

$$A_v \propto g_m \cdot R_D \quad (1)$$

The current bleeding circuit 130 and the transconductance stage 110 are made up the inverter structure. The inverter structure consisted of the current bleeding circuit 130 and transconductance stage 110 may give the frequency conversion mixer both a current bleeding effect and a current reuse effect. The current reuse technique also increases the conversion gain $A_v$ of the frequency conversion mixer 100 by doubling the transconductance $g_m$ of the frequency conversion mixer 100. Since the RF signal is inputted to the gate of the transconductance stage 110 and current bleeding circuit 130 simultaneously, the RF signal is amplified at both NMOS transistor of the transconductance stage ($g_{mn}$) and PMOS transistor of the current bleeding circuit ($g_{mp}$). For example, as illustrated in FIG. 1, the RF signal RF+ is simultaneously inputted to the gate of the PMOS transistor M3 of the current bleeding circuit 130 and the gate of the NMOS transistor M1 of the transconductance stage 110. Moreover, the RF signal RF− is simultaneously inputted to the gate of the PMOS transistor M4 of the current bleeding circuit 130 and the gate of the NMOS transistor M2 of the transconductance stage 110. As expressed in Equation (2), the conversion gain $A_v$ of the frequency conversion mixer may increases more than only using current bleeding.

$$A_v \propto (g_{mp} + g_{mn}) \cdot R_D \quad (2)$$

Since an inverter structure is implemented with the current bleeding circuit 130 and the transconductance stage 110, as expressed in Equation (2), the conversion gain $A_v$ of the frequency conversion mixer 100 increases by the current bleeding and current reuse effects. In the frequency mixing operation of the frequency conversion mixer 100, the RF signals RF+ and RF− are amplified in the transconductance stage 110 and are also amplified in the current bleeding circuit 130.

Referring to Equation (2), the conversion gain $A_v$ of the frequency conversion mixer 100 is proportional to a value that is obtained by multiplying the resistance value $R_D$ by the sum of the transconductance $g_{mn}$ of the transconductance stage 110 and the transconductance $g_{mp}$ of the current bleeding circuit 130. Herein, the resistance value $R_D$ is the resistance value of each of the first and second resistors R1 and R2 of the load stage 140

Moreover, the inverter structure consisted of the transconductance stage 110 and the current bleeding circuit 130 improves noise characteristic by increasing the conversion gain $A_v$ of the frequency conversion mixer 100. Consequently, the noise characteristic and sensitivity of an entire receiver system are improved The frequency conversion mixer 100 is used in a direct conversion receiver. Herein, the direct frequency conversion mixer directly down-converts the RF signals RF+ and RF−, which are received through the antenna, into a baseband frequency without converting the RF signals RF+ and RF− into an intermediate frequency. The most importance characteristic of the direct frequency conversion mixer is a flicker noise. Herein, the flicker noise is the noise of a low frequency band, unlike thermal noise that evenly appears over an entire frequency band. The flicker noise increases toward a baseband. The reason that the flicker noise is important in a direct frequency conversion mixer is because the noise of a baseband cannot be removed by directly down-converting a frequency into the baseband.

Generally, the reason that a flicker noise appears in a frequency conversion mixer is because the switching operation of a switching stage is non-ideal. The oscillation signals LO+ and LO− generated by the local oscillator have opposite phases, and a switching operation is performed by the oscillation signals LO+ and LO−. At this point, an ideal switching signal is oriented toward a square-wave signal. However, it is substantially impossible to generate the square-wave signal. Consequently, it is impossible to perform an ideal switching operation.

Particularly, in a millimeter band such as a K band, the parasitic capacitor component of a transistor may considerably be fatal to the characteristic of a circuit itself. Because of the parasitic capacitance component, the parasitic capacitance of the transistor of a switching stage is charged/discharged in an operation of performing a switching operation, and thus a switching signal can be distorted. That is, a flicker noise largely increases.

The resonant inductor L 135 is used to decrease noise that is generated in the parasitic capacitance of the nodes N1, N2 between transconductance stage 110 and switching stage 120. Herein, the noise generated in the parasitic capacitance is eliminated by a filter that is configured with the resonant inductor L 135 and the parasitic capacitors of the transistors M3 to M8. The resonant inductor L 135 is connected between the first and second nodes N1 and N2, and resonate the parasitic capacitor components of the first and second nodes N1 and N2. Therefore, the noise characteristic of the frequency mixer may be improved. Since the resonant inductor L 135 keeps the high frequency signals from leaking through parasitic capacitors at the nodes N1 and N2 between transconductance stage 110 and switching stage 120, conversion gain at the high frequency also increase. And lastly, an appropriate inductance of resonant inductor L 135 may have the good gain flatness because of an appropriate resonant point by the resonant inductor L 135 and the parasitic capacitor.

Generally, the previous works about the K-band Mixer include at least two resonant inductors, for increasing a conversion gain and improving noise characteristic. However, the use of the many resonant inductors is the reason of that enlarges the chip size of a mixer. In present invention, a frequency conversion mixer 100 uses only one inductor. Therefore, an occupied area is decreased rather than previous works even while improving the conversion gain, noise characteristic and the frequency bandwidth.

The bias stage 150 includes a current source for providing a more stable current to the transconductance stage 110. The bias stage 150 is connected between the transconductance stage 110 and a ground terminal GND. The bias stage 150 includes a transistor M9. Herein, the transistor M9 has a gate to which a bias voltage is applied, a drain which is connected to the source of the first transistor M1, and a source which is connected to the ground terminal GND.

The bias stage 150 in FIG. 1 is implemented as one current source, but it is not limited thereto. The bias stage 150 may include at least one current source.

Figure 2:
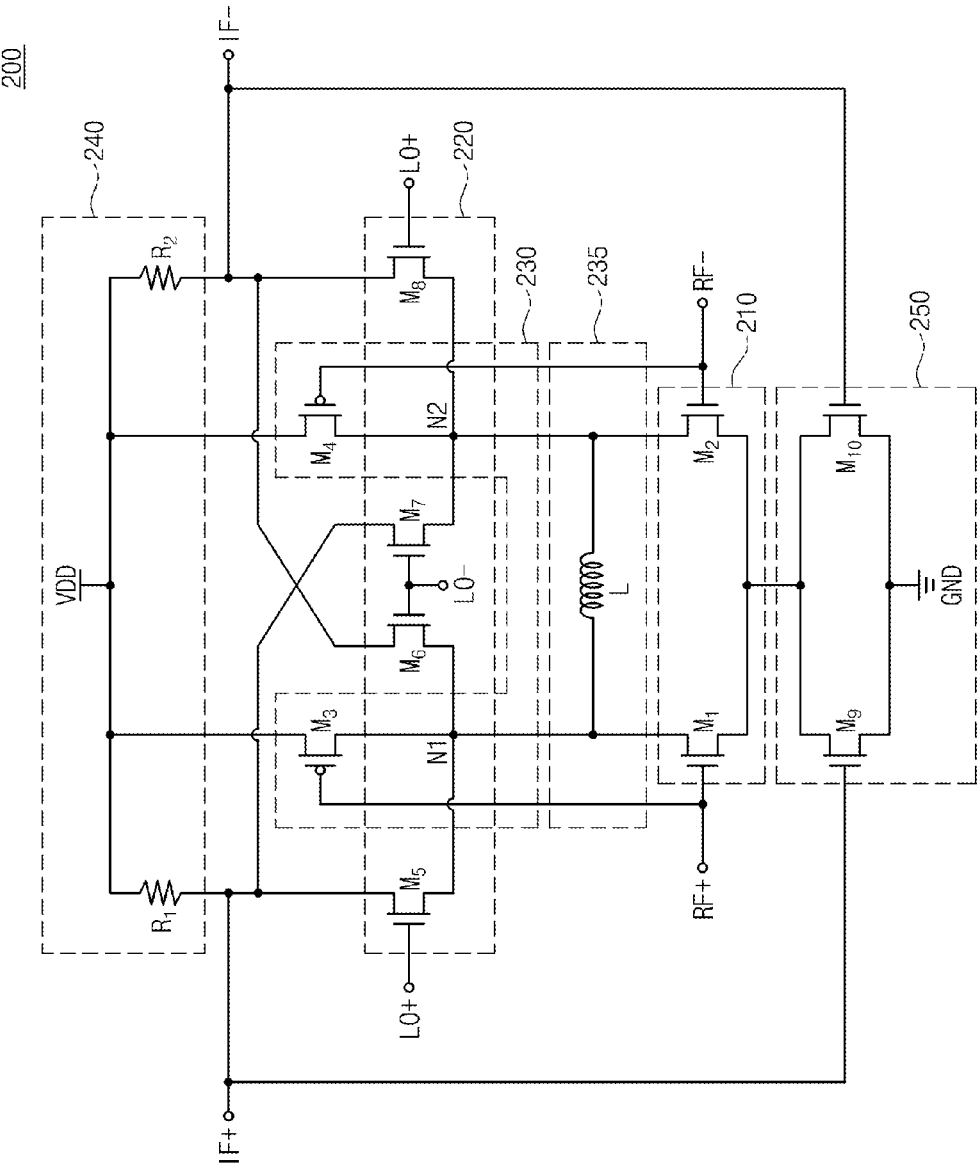
FIG. 2 is a diagram illustrating a frequency conversion mixer according to another embodiment of the present invention.

FIG. 2 is a diagram illustrating a frequency conversion mixer according to another embodiment of the present invention. This embodiment is designed to more improve flicker noise in the K-band direct conversion mixer.

Referring to FIG. 2, a frequency conversion mixer 200 according to another embodiment of the present invention includes a transconductance stage 210, a switching stage 220, a current bleeding circuit 230, a resonant inductor 235, a load stage 240, and a bias stage 250. Herein, the transconductance stage 210, the switching stage 220, the current bleeding circuit 230, the resonant inductor L 235, and the load stage 240 are implemented, identically to the transconductance stage 110, the switching stage 120, the current bleeding circuit 130, the resonant inductor L 135, and the load stage 140 in FIG. 1.

The frequency conversion mixer 200 includes the bias stage 250 applying a switched biasing technology. The bias stage 250 adds a current source unlike the bias stage 150 in FIG. 1, thereby decreasing a flicker noise.

Referring again to FIG. 2, switched biasing technique is adopted. The idea of switched biasing technique is to make the tail current source as two separate half-size transistors ($M_9$ and $M_{10}$) for same current with the fixed-biasing and then to switch then alternately using the output signals with the IF frequency, which will result in the lower flicker noise with the same DC current supply. This technique may reduce flicker noise of the transistor by operating it between strong inversion and accumulation region. The frequency conversion mixer 200 uses a switched biasing current source, thereby improving the flicker noise characteristics of transistors.

Figure 3:
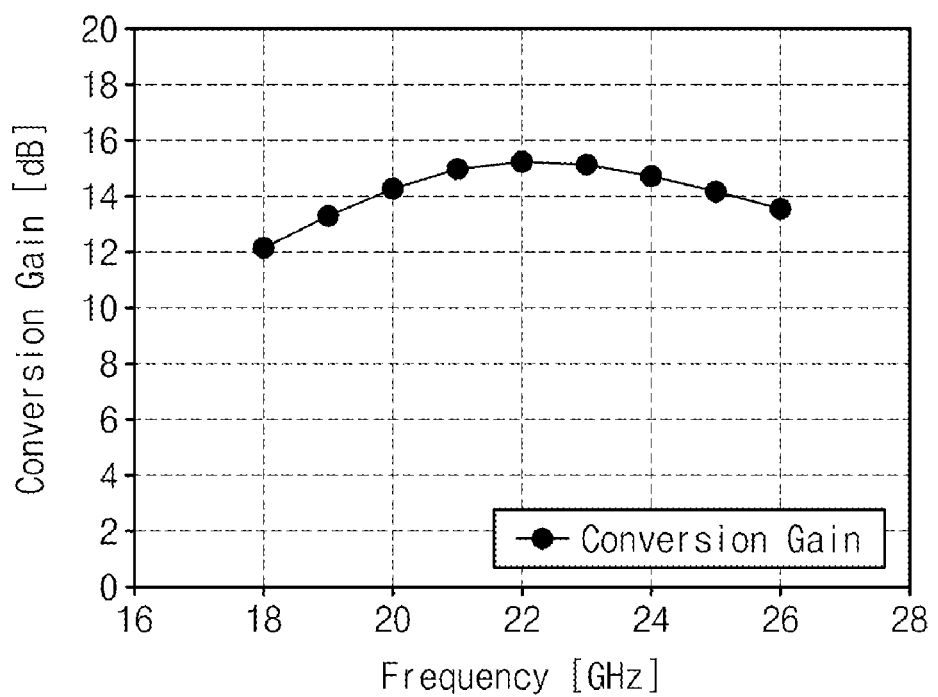
FIG. 3 is a diagram showing a conversion gain of a K-band band in the frequency conversion mixer according to embodiments of the present invention.

FIG. 3 is a diagram showing the conversion gain $A_v$ of the RF frequency of a K-band band (18 to 26 GHz) in the frequency conversion mixer according to embodiments of the present invention.

Referring to FIG. 3, the conversion gain $A_v$ of the frequency conversion mixer generally has flat characteristic in a K-band band. Particularly, the conversion gain $A_v$ in the K-band band has difference within 3 dB. The highest gain is about 15.47 dB at 23 GHz, and the lowest gain is about 12.83 dB at 18 GHz.

Figure 4:
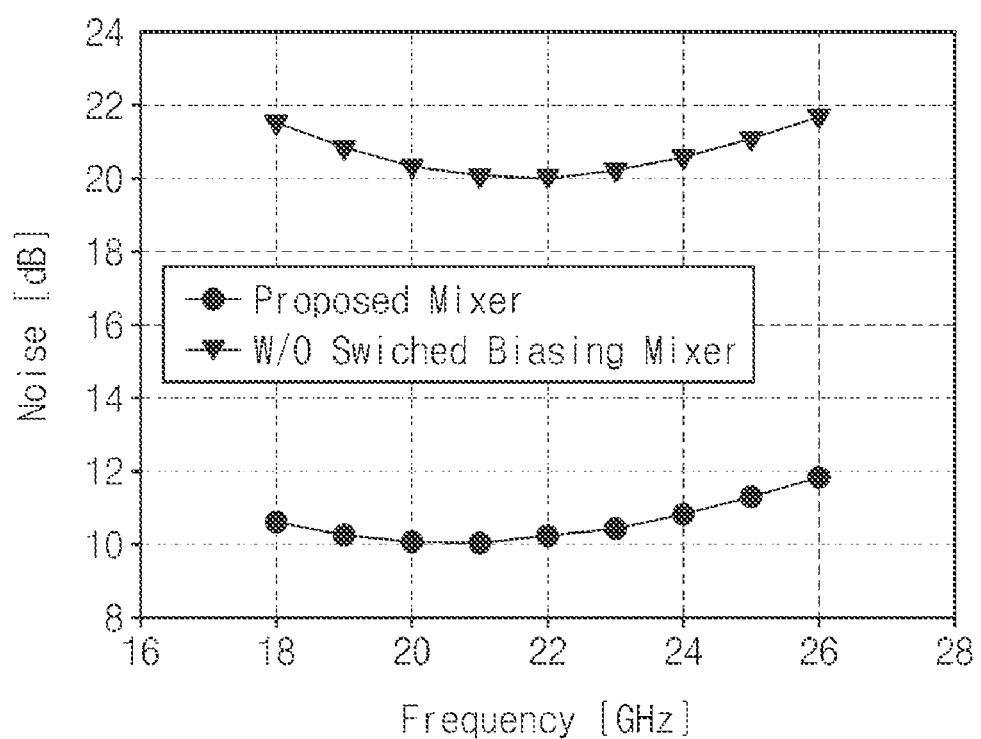
FIG. 4 is a diagram showing a noise figure of a K-band band in the frequency conversion mixer according to embodiments of the present invention.

FIG. 4 is a diagram showing a noise figure of a K-band band in the frequency conversion mixer according to embodiments of the present invention.

Referring to FIG. 4, the noise figure of the frequency conversion mixer 200 (see FIG. 2) using a switched biasing is lower than that of the frequency conversion mixer 100 (see FIG. 1) using no switched biasing. That is, noise characteristic when using the switched biasing is better than noise characteristic when using no switched biasing. The frequency conversion mixer 200 using the switched biasing has the better noise characteristic of approximately 10 dB than the frequency conversion mixer 100 using no switched biasing. The lowest noise figure is about 10.03 dB at 21 GHz, and the highest noise figure is about 11.83 dB at 26 GHz.

The frequency conversion mixers 100 and 200 according to embodiments of the present invention have the power consumption of about 8.25 mW in the supply voltage terminal of 1.8 V. This is an approximately two times lower value than a technology that has been presented through a CMOS process, in terms of power consumption. As −14.7 dBm, moreover, an IIP3 value at 24 GHz is good.

As described above, the frequency conversion mixer according to embodiments of the present invention includes the inverter structure consisted of the transconductance stage and the current bleeding circuit, thereby improving the conversion gain and noise characteristic.

Moreover, the frequency conversion mixer according to embodiments of the present invention includes one resonant inductor, and thus can minimize an occupied area even while improving noise characteristic related to the previous works. And an appropriate inductance of inductor may have the good gain flatness.

Lastly, the frequency conversion mixer according to embodiments of the present invention includes the switched biasing current source, thereby more improving the flicker noise of the frequency conversion mixer.

The above-disclosed subject matter is to be considered illustrative, and not restrictive, and the appended claims are intended to cover all such modifications, enhancements, and other embodiments, which fall within the true spirit and scope of the present invention. Thus; to the maximum extent allowed by law, the scope of the present invention is to be determined by the broadest permissible interpretation of the following claims and their equivalents, and shall not be restricted or limited by the foregoing detailed description.

What is claimed is:

1. A frequency conversion mixer, comprising:
   a transconductance stage configured to receive a Radio Frequency (RF) signal, and to output a current corresponding to a voltage of the RF signal;
   a switching stage configured to switch the current outputted from the transconductance stage in response to a local oscillation signal, thereby mixing the RF signal and the local oscillation signal to output an intermediate frequency (IF) signal;
   a load stage connected between the switching stage and a supply voltage terminal;
   a current bleeding circuit connected in parallel with the switching stage to get a current bleeding effect and a current reuse effect;
   a resonant inductor configured to reduce noise that is generated in parasitic capacitance at a node between the transconductance stage and the switching stage; and
   a bias stage connected between the transconductance stage and a ground terminal and having at least one current source for allowing a stable current to flow in the transconductance stage,
   wherein the bias stage is activated for a switched biasing in response to the intermediate frequency signal.

2. The frequency conversion mixer of claim 1, wherein the RF signal has a frequency ranging from about 18 GHz to about 26 GHz.

3. The frequency conversion mixer of claim 1, wherein the transconductance stage and current bleeding circuit are configured to make an inverter structure to increase a conversion gain of the RF signal.

4. A frequency conversion mixer, comprising:
   a first transistor having a gate receiving a positive Radio Frequency (RF) signal, and a drain connected to a first node;
   a second transistor having a gate receiving a negative RF signal, a drain connected to a second node, and a source connected to a source of the first transistor;
   a resonant inductor connected between the first node and the second node;
   a third transistor having a gate receiving the positive RF signal, a source connected to a supply voltage terminal, and a drain connected to the first node;
   a fourth transistor having a gate receiving the negative RF signal, a source connected to the supply voltage terminal, and a drain connected to the second node;
   a fifth transistor having a gate receiving a positive oscillation signal, a drain connected to a positive output node, and a source connected to the first node;
   a sixth transistor having a gate receiving a negative oscillation signal, a drain connected to a negative output node, and a source connected to the first node;
   a seventh transistor having a gate receiving the negative oscillation signal, a drain connected to the positive output node, and a source connected to the second node;
   an eighth transistor having a gate receiving the positive oscillation signal, a drain connected to the negative output node, and a source connected to the second node;
   a first resistor connected between the positive output node and the supply voltage terminal;
   a second resistor connected between the negative output node and the supply voltage terminal; and
   a bias stage connected between the source of the first transistor and the ground terminal,
   wherein positive and negative intermediate frequency signals are output through the positive and negative output nodes, respectively, and the bias stage is activated for a switched biasing in response to the positive and negative intermediate frequency signals.

5. The frequency conversion mixer of claim 4, wherein the bias stage comprises:
   a ninth transistor having a gate connected to the positive output node, a drain connected to the source of the first transistor, and a source connected to the ground terminal; and
   a tenth transistor having a gate connected to the negative output node, a drain connected to the source of the first transistor, and a source connected to the ground terminal.

6. The frequency conversion mixer of claim 4, wherein the RF signal has a frequency ranging from about 18 GHz to about 26 GHz.

* * * * *